US005757653A

United States Patent [19]
Christian et al.

[11] Patent Number: 5,757,653
[45] Date of Patent: May 26, 1998

[54] METHOD AND APPARATUS FOR DYNAMICALLY VARYING NET RULES

[75] Inventors: Kenneth L. Christian; Timothy A. Schell, both of Dutchess County; Craig R. Selinger, Rockland County, all of N.Y.

[73] Assignee: International Business Machines Corporation, Armonk, N.Y.

[21] Appl. No.: 648,800

[22] Filed: May 16, 1996

[51] Int. Cl.⁶ .................................................. G06F 17/50
[52] U.S. Cl. .................................... 364/488; 364/489
[58] Field of Search .................................. 364/488, 489, 364/490, 491, 578

[56] References Cited

U.S. PATENT DOCUMENTS

| | | | |
|---|---|---|---|
| 4,495,559 | 1/1985 | Gelatt Jr., et al. | 364/148 |
| 4,613,941 | 9/1986 | Smith et al. | 364/490 |
| 4,700,316 | 10/1987 | Nair | 364/488 |
| 4,758,947 | 7/1988 | Levendel et al. | 364/200 |
| 4,763,288 | 8/1988 | Deering et al. | 364/578 |
| 4,965,739 | 10/1990 | Ng | 364/491 |
| 5,081,602 | 1/1992 | Glover | 364/578 |
| 5,095,441 | 3/1992 | Hopper et al. | 364/489 |
| 5,175,696 | 12/1992 | Hooper et al. | 364/489 |
| 5,212,650 | 5/1993 | Hooper et al. | 364/489 |
| 5,218,551 | 6/1993 | Agrawal et al. | 364/490 |
| 5,231,589 | 7/1993 | Itoh et al. | 364/490 |
| 5,237,514 | 8/1993 | Curtin | 364/490 |
| 5,267,175 | 11/1993 | Hooper | 364/489 |
| 5,309,372 | 5/1994 | Marui et al. | 364/491 |
| 5,311,443 | 5/1994 | Crain et al. | 364/491 |
| 5,359,539 | 10/1994 | Matsumoto et al. | 364/489 |
| 5,367,469 | 11/1994 | Hartoog | 364/491 |
| 5,391,993 | 2/1995 | Khazam et al. | 324/684 |
| 5,392,222 | 2/1995 | Noble | 364/490 |
| 5,519,630 | 5/1996 | Nishiyama et al. | 364/490 |
| 5,548,747 | 8/1996 | Rudolph | 364/500 |
| 5,648,912 | 7/1997 | Narayanan et al. | 364/491 |

*Primary Examiner*—Emanuel Todd Voeltz
*Assistant Examiner*—Leigh Marie Garbowski
*Attorney, Agent, or Firm*—Whitham, Curtis & Whitham; Alison Mortinger

[57] ABSTRACT

Permutations of orders of elements such as electrical connection pins, vias and t-junctions at known locations are efficiently tested against at least type and distance criteria by forming a plurality of lists of the elements and screening the elements of each list against respective ones of said type criteria to reduce the length of the lists of elements. Pointers to ones of the distance criteria and remaining members of a list corresponding to respective ones of the distance criteria iteratively form pairs of elements which are checked for separation. When the check fails or a solution is found, the pointer to list members is advanced. The pointer to respective distance criteria is advanced when a check is successful. When a list is exhausted and a check is unsuccessful, the pointer to respective distance criteria is regressed. Advancement and regression of pointers reduces iterations of combinations of pairs of elements which do not lead to a solution in order to accelerate the process. Each new solution is evaluated against a single stored prior solution for optimization of solutions while greatly reducing storage requirements.

20 Claims, 3 Drawing Sheets

METHOD AND APPARATUS FOR DYNAMICALLY VARYING NET RULES

BACKGROUND OF THE INVENTION

1. Field of the Invention

The present invention generally relates to the design of complex integrated circuits, modular circuit packages and circuit boards and, more particularly, to computerized methodology for evaluating the layout of wiring connections within an integrated circuit, modular circuit packages or board.

2. Description of the Prior Art

The high performance expected from electronic devices has, for some years, caused component interconnections to become a critical aspect of design of boards, packages and even chips due to the time required for propagation of signals therein. For the same reason, integration density of chips has increased and modular circuits have been developed to allow numerous chips to be included and interconnected within a small, compact circuit package in which connection distances can be minimized. In much the same manner, circuit boards allow support of components and circuit packages in close proximity to reduce connection distances while adding design constraints based on connection length, net topology and electrical interface compatibility. However, the increased complexity caused by increased compactness and number of components in a chip, modular circuit package or board has increased the difficulty of circuit wiring design and component placement and optimization of designs, in particular.

Accordingly, most complex circuit layouts are currently designed with the aid of powerful data processors and numerous algorithms have been developed for such a purpose. The problems of location of components and connections thereto and connection routing, generally referred to in the art as net ordering and pin assignment, is essentially one in which the order or sequence of connection of pins along a connection having a particular topology (e.g. linear, branched, etc.) and the identification of each pin (e.g. as an input or output of a particular component) is determined in accordance with constraints of signal propagation time, sometimes referred to as slack, or connection length, including resistance and capacitance, along signal paths. Such algorithms have generally been developed using one of two approaches. Both approaches and the underlying concepts are well-understood in the art.

One approach which involves pattern matching is to define rigid wiring rules, referred to as a net rule, and to exhaustively iterate all possible routing patterns and pin assignments and simulate performance of each design for optimization. A net is a common connection between an arbitrary number, n, of pins or locations (e.g. vias) to be connected. A typical board or modular circuit design at the present time will include approximately three thousand nets with a large or complex current design including three to five times that number of nets. Generally, the number of permutations generated in pin assignment according to this approach for a single net is n! and large amounts of memory (n*n!) are required to support performance of the exhaustive computations even for a single net. The process is also very slow even when so-called mark off algorithms are used to avoid evaluation of duplicate error conditions. Such methods are also restrictive as to the number of pins which can be supported in one net because of practical limitations on available memory and reasonable computing time. For example, the number of pins in a net is usually limited to about eight to eleven pins since eleven pins yields nearly forty million permutations which must be individually checked for pattern matching.

The other approach allows maximum flexibility by avoiding the use of wiring rules and detailed constraints associated therewith. Resulting designs are then checked against operational constraints by simulation. Accordingly, the process is extremely fast and requires only small amounts of memory for a single solution at a time. However, this second approach does not directly support optimization of a design and lacks accuracy (e.g. can produce results contrary to design rules or which cannot be physically realized) and the capability of checking results against wiring rules, as is provided by the first approach. Further, even though simulation on a single solution for a net is fast and memory efficient, the simulation model of the board or modular circuit or the like is complex. Therefore, for both typical and large current designs containing thousands of nets, as noted above, the run time for simulation is often measured in days.

It can be readily understood that these two approaches are so diametrically opposed in concept that attempts to solve the difficulties or transfer advantages of either approach to the other have been unsuccessful. That is, currently available options are either virtually fixed by rigid wiring rules or virtually unencumbered by them. There has been no way to reduce memory and computational requirements without loss of accuracy, rule checking and optimization facilities. Conversely, there has been no way to provide such accuracy, rule checking and optimization facilities without large and complex iteration of all possible permutations involving extremely large numbers of complex computations which effectively limit the number of pins to which the methodology can be practically applied.

SUMMARY OF THE INVENTION

It is therefore an object of the present invention to provide an efficient apparatus and methodology for accurate pin assignment and net ordering which accommodates checking against wiring rules and supports optimization.

It is another object of the invention to reduce computational and storage requirements for accurate pin assignment and net ordering which supports checking against wiring rules and optimization.

In order to accomplish these and other objects of the invention, a method and apparatus for checking an ordering of a plurality of elements against desired criteria is provided including the steps of forming a plurality of lists of elements, dividing the desired criteria into a plurality of first criteria and a plurality of said second criteria, screening elements in the lists against respective ones of the first criteria to limit the lists to elements which match respective first criteria, and comparing pairs of remaining elements in different lists against respective second criteria.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
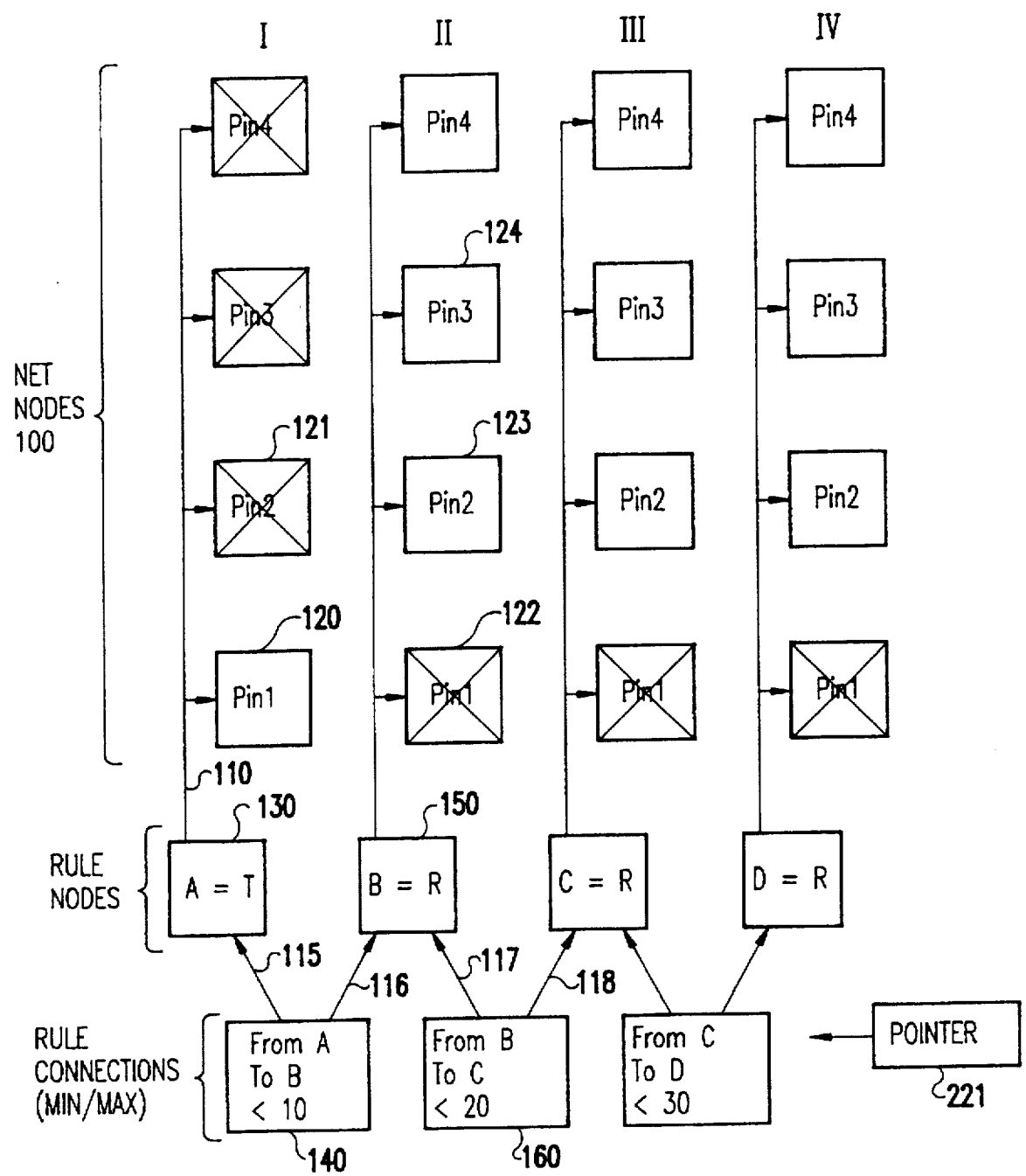
FIG. 1 is a block diagram schematically illustrating the invention.

Referring now to the drawings, and more particularly to FIG. 1, there is shown a block diagram showing a relationship of rule connections, rule nodes and net nodes useful in understanding the invention. For purposes of the following discussion, a rule connection is a part of the net rule which defines the associative connectivity of a net. For example, the net can be a distributed net, sometimes referred to as a linear, non-branching, distributed or daisy chain, which is a net that provides connections serially from point to point without any branches greater than one vector. The rule connection is divided in FIG. 1 into a plurality of to/from rules (e.g. from A to B, from B to C) which are associated by the connection rule. In the case illustrated, the connection rule defines a daisy chain connection without branches.

(A branching or cluster connection would include duplication of a node in the "from" portion of at least two such rules, such as from B to C and from B to D. For example, branching nets may be classified for convenience as a near end cluster or a far end cluster. A near end cluster is a net that has more than one wiring vector originating from the first pin and at least one pin on each vector. The number of pins serially connected to each vector is not limited but each pin on each vector can have only one subsequent vector. A far end cluster is a net that has one pin connected to a second pin where the second pin has more than the one vector originating at the first pin and at least one pin on each vector. Like the near end cluster, the number of pins on each vector is unlimited but each pin can have only a single subsequent vector. However, it is to be understood that the invention is not limited to the above-described conventions and other branching topologies such as trees with branching from some or all pins may be accommodated in accordance with the methodology of the invention.)

In FIG. 1, the rule node represents the singular nodal component of the net (e.g. via pin or t-junction (where the net splits without a physical pin but which can be handled as if a pin existed)) which, when connected together as defined in the rule connection defines a net. A physical pin is to be assigned to each rule node as a result of the pin assignment and net ordering performed by the invention. Net nodes are actual instances of physical pins as they exist in a real design.

It should also be understood that FIG. 1 is directed to a four pin net for simplicity and clarity and the net nodes form a four-by-four matrix. In the generalized case, an n * n matrix will be sufficient and would be comprised of registers (e.g. 120) of sufficient capacity to store at least an index, an identifier and a physical location. In this regard it should be understood that the block diagram of FIG. 1 represents apparatus capable of performing the methodology of the invention. While it is preferred to carry out the invention by a suitably programmed general purpose data processor, such registers will be allocated therein during initialization. Similarly, arrows such as 110 and 115 are pointers to structures on which digital data comparisons are to be carried out. Suitable digital comparators which are also intended to be symbolically illustrated thereby could be embodied in hardware (for a special purpose processor) or software and which are common database operations familiar to those skilled in the art. The particular operation or the arrangement by which it is carried out is not critical to the practice of the invention. Pointers are preferably provided in software in the form of a linked list. In a hardware embodiment, up/down counters of any type would be suitable to provide a sequential pointing function.

It should also be appreciated that the known iterative approach, described above requires storage which may also be considered as being in a matrix form but in which each of the n! permutations would occupy a row with n columns. For example where n=7, the necessary matrix for the traditional method would be 7*5040 rather than 7*7 yielding a savings in memory usage of over 99%. The relative savings in memory space increases substantially as n increases and the invention is effectively unlimited as to the number of pins in a net which can be supported.

Rule nodes (e.g. 130) are similarly registers of sufficient capacity to store data to identify the node constraints and a pointer, symbolically indicated by branching of arrow 110. The node constraints, for example, may include but are not limited to node type constraints (e.g. via, pin or T-junction) including circuit type constraints (e.g. transmitter or driver of the node, receiver, book name, fast or slow performance, etc.) or package constraints (e.g. component placement or package name) These constraints are tested against attributes of the selected net node during the ordering process (e.g. at 203 of FIG. 2). For example, typically there will be only one transmitter or input to a connection or node unless several so-called tri-state devices (e.g. having a high impedance output state) or the like is connected to the net. The remainder of the pins will typically be receivers or outputs. In this regard, it should be appreciated that each pin will have an identifier which will similarly identify it as an input or output of a device or component and this particular architecture allows comparison 110 of the rule node with the identifier to be readily carried out as will be discussed more fully below. Other constraints such as those mentioned above may be handled in the same manner to determine whether or not the pin matches the constraints contained in the rule node and need not be discussed individually.

The rule connections (e.g. 140) are similarly registers of sufficient capacity to store data which identifies the net connection constraints and identify the identity of the connection (e.g. "from" and "to") and a pointer to one of the "from" and "to" connections symbolized, collectively with an evaluation operation, by arrows such as 115–118. These constraints are tested against the attributes of the selected net connection during the ordering process (e.g. at 217 of FIG. 2A) in such an evaluation operation. The net constraints, in accordance with the preferred form of the invention often include minimum and/or maximum wire length, wire type or any other physical or electrical constraints of interest against which a connection is to be tested. For example, in register 140 as illustrated in FIG. 1, from A to B and a maximum length of 10 units is specified.

The hierarchy of the rule nodes and the rule connections allows a comparison of physical locations of pins to determine whether or not the connection can be made within the length or other constraint by accessing the pins in the list for each rule node in sequence, as will be more fully discussed below. In this way, invalid pins can be deleted from each list prior to any iterations for connection evaluation which greatly accelerates processing by preventing iterations of impossible or non-conforming connections.

The following assumptions are made as a basis for the methodology which will now be described:

1.) a collection of nets exists, of which each net includes a collection of net nodes,
2.) a collection of rules exists, of which each rule is defined as a collection of rule nodes and rule connections, and
3.) a best rule criteria exists which defines criteria for judging the best or comparatively better ordering (e.g. timing, length, capacitance etc.) between different solutions (e.g. nets).

Figure 2:
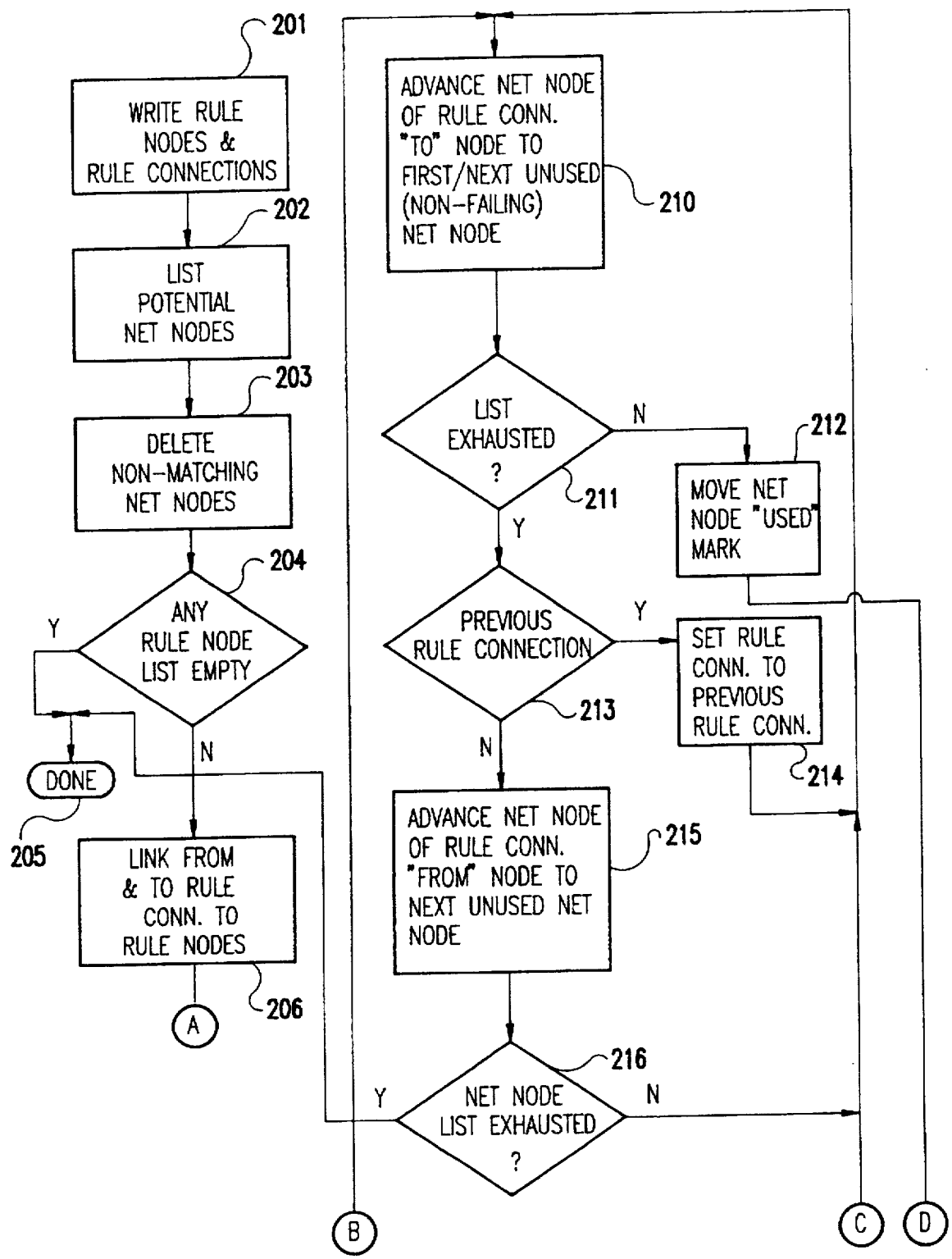
FIG. 2A and 2A collectively are a high level flow chart illustrating the methodology of the invention.
Figure 2A:
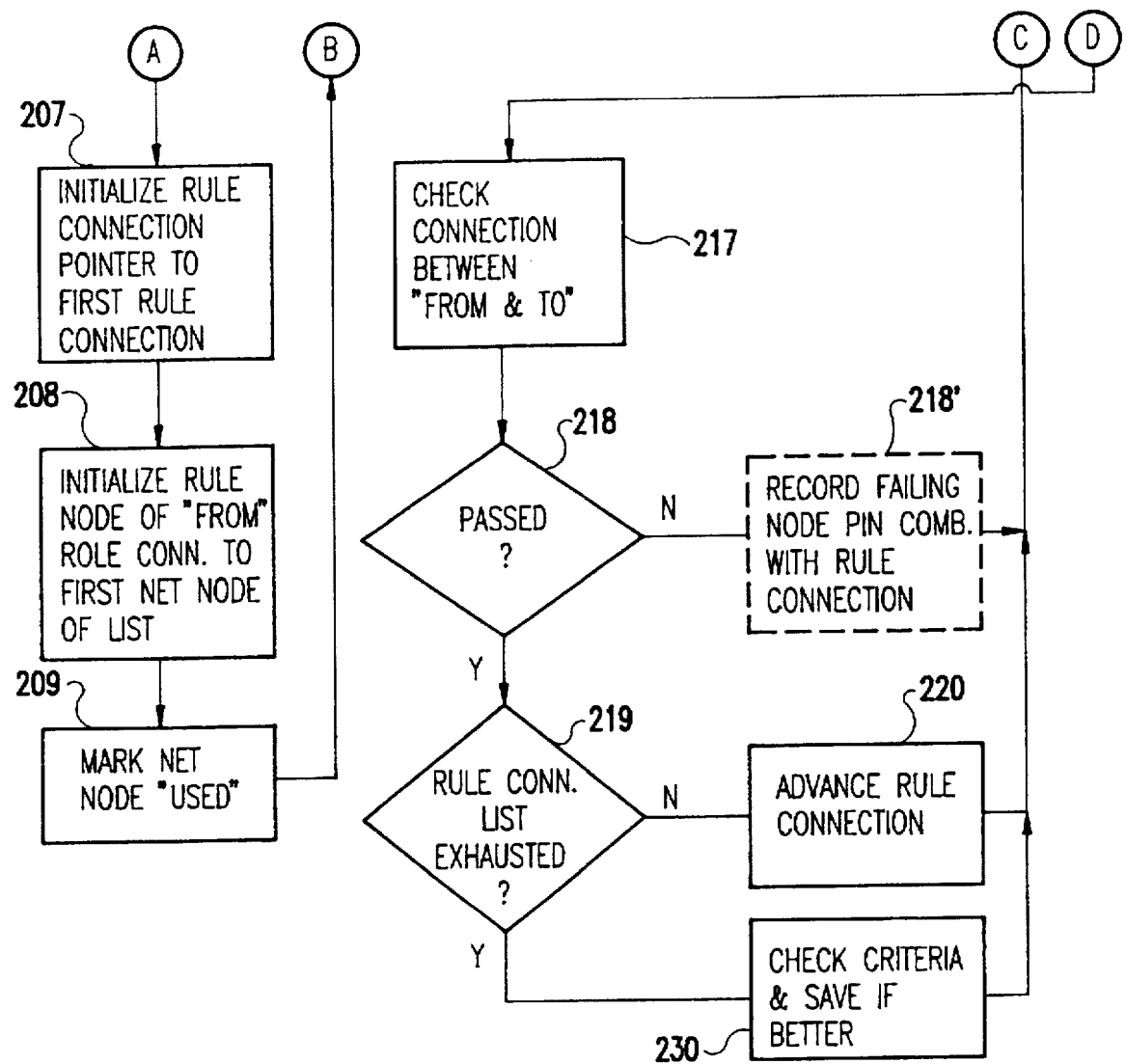

Referring now also to FIG. 2–2A, as well as FIG. 1, the methodology of the invention as carried out by the apparatus symbolically illustrated in FIG. 1 will now be discussed. The process begins with the entry 201, by an operator or from a file, the information contained in the rule nodes and rule connections. The information in a rule node would normally be a statement such as "set node A transmitter", "set node B receiver", etc. For a rule connection a corresponding statement might be "set connection A B 10", as indicated at 140 of FIG. 1. The group of rule connections would implicitly define net type (e.g. power or signal) and topology (e.g. daisy chain or branching). The potential net nodes represented by pin locations and numbers are then listed from the design and entered into registers 120, 121, etc. preferably in corresponding rows of each column I–IV of the net node matrix 100 forming a net lode list in each such column according to an associated rule node. Maintaining the same order of pins in each net node list by confining a pin to a single row is convenient for application and movement of "used" markers during operation of the invention, as will be described below.

The pin types of the net nodes are then compared with the pin types of the rule node and non-matching net nodes are deleted from each list. In this case pin 1 is a transmitter and pin 2, pin 3 and pin 4 are receivers. Accordingly pin 2, pin 3 and pin 4 are deleted from column I since rule node 130 specifies that node A must be a transmitter. Similarly, pin 1 (e.g. net node 122) is deleted from each of columns II, III and IV since other rule nodes (e.g. 150) specify that the corresponding net node must be a receiver. Additional deletions could be made based on other constraints specified by each rule node. This procedure immediately shortens the lists which must be examined in the following checking procedure and serves to substantially accelerate the processing. Further, if any list is empty, as determined at 204 pin assignment and net ordering will not be possible and the process can be terminated at 205.

Assuming that each rule node has at least one potential node in its associated list, the "to" and "from" connections of the rule connections are linked to the rule nodes at 206 and, in turn, to the rule node lists of net nodes by comparison of the arguments of the connection statement with the names of the nodes corresponding to each rule node. Then a rule connection pointer 221 is initialized at 207 to point to the first rule connection (e.g. 140). The order of the rule connections is not particularly important. The rule node 130 corresponding to the "from" node/pointer 115, preferably contained within the rule connection 140 which is, in turn, specified by pointer 221, is set at 208 to the first unused (and valid) net node in the corresponding column, in this case, net node 120, which is then marked "used" at 209.

At this point, the ordering and checking process can begin. The rule node pointer is advanced at 210 to, in this case, rule node 150 selected by the "to" pointer 116 of the rule connection selected by pointer 221 and the net node pointer of rule node 150 is advanced to the first/next unused (valid) net node, in this case 123. Advancing the net node pointer includes marking the present (e.g. currently marked "used") net node (if any) "unused" and then advancing the net node pointer to the next net node which is then marked "used". It should be noted that the "used"/"unused" mark, however implemented, is applied to the respective pin and, hence, to a row in all columns of the net node matrix. At 211, the net node list is tested to determine if the net node list is exhausted and, if not, the net node is marked "used" at 212. If the net node list is exhausted, the rule connection selected by pointer 221 is tested for the existence of a previous rule connection at 213. At this point, there is not, but in a later iteration, for example at rule connection 160, a previous rule connection would exist and, as will be more fully discussed below, this would reflect a condition that a connection match could not be made within the present pin order developed to that point.

This process thus allows the attempted pin assignment and net ordering to be backed up to attempt another pin assignment and net ordering. At the same time, the amount of regression (or backing up in the process) is minimized to eliminate only the pin assignment and net ordering assignments found to be in conflict with other, subsequent, pin assignments. Further, as the net nodes are again advanced and rule connection checks are made, unsuccessful combinations of pin assignments which are not includable in a solution are not retried by the expedient of immediately advancing the pointer in the rule node to the next unused net node if one exists (which suppresses iterations of further pin assignment which would include the failed combination together with conditionally accepted pin assignments) and regressing the process when found necessary due to exhaustion of the net node list.

It should be noted that some constraints such as the length of a connection between two assigned pins (e.g. a "to-from" connection corresponding to a particular rule connection such as 160) may be of a nature such that if a particular pair (or combination) of pins assigned to that connection fails in combination with any other combination of pins which may have been conditionally assigned up to that point in the process, it may be inferred that pair of pins for that connection will also fail with all other combinations of assigned pins. Since length of each connection or another constraint giving rise to such an inference is expected to be used in the principally intended application of the basic invention, it is preferred to include, as a perfecting feature, the further step 218' of recording the failing node pin combination with the rule connection prior to looping. Then, when the net node is advanced at 210 in the course of the loop, the next unused net node can be quickly checked against the failing pin combination, as indicated by the legend "(non-failing)", and the iteration suppressed to further greatly accelerate the process in accordance with the invention.

It is possible, of course, to record the failing combination with flags at the net node or to use other arrangements for the same purpose. However, storage in association with the rule connection is considered preferable as both corresponding to the from-to connection defined therein and allowing information regarding a failed pin combination to be propagated to the pointer contained in the rule node when iterations involving the same "from" pin are being iterated. It is also to be understood that while this perfecting feature further accelerates the process in accordance with the invention, it is not necessary to the practice of the basic invention which provides much more rapid processing than previously known methodologies by advancing the net node immediately when a tested connection fails and minimizing regression when a net node list is exhausted.

Assuming there is no previous rule connection, pointer 110 is advanced to advance the net node of the current rule connection "from" node to the next unused net node as shown at 215 and the corresponding net node list is checked to determine if it is exhausted at 216. if the rule connection list is exhausted, there is no solution (or further solution in a later iteration if a solution has previously been found) to connection of the net and the process branches to "done" 205. That is, the pin ordering search has been exhausted (even though pin assignments may not have been attempted for numerous rule nodes/columns).

If not, the process loops to 210, the net node is again advanced to the "to" node of the rule connection and the next unused net node in the corresponding net node list. The net node list is again checked at 211 to determine if any net nodes remain in the list and, if so, it is marked as used at 212, as described above.

Assuming that this is the first iteration in the process, net node 123 would be the first unused net node in the list corresponding to the "to" node of the rule connection. (Net node 122 was deleted from the list since it is a transmitter pin and does not match rule node 150 specifying a receiver or some other criteria included in the rule node.) At this point, the "from" pin and the "to" have been specified and a connection between these pins may be tested in accordance with the rule connection for length and any other wiring rules specified in the rule connection 140 at 217. It should be noted that it is preferred to perform the method of the invention at an early stage of the design using a so-called Manhattan distance along idealized vectors in one of three orthogonal directions and to perform the process again on the final design after component locations and wiring conflicts have been revised and refined.

If the connection between two pins does not meet the rule connection conditions, as determined at 218, the process loops to test a connection between the same "from" pin and the next pin corresponding to the next "to" node (e.g. the net node is immediately advanced to, for example, 124 unless the net node list is exhausted). If the connection passes, the rule connections are checked at 219 to determine if the rule connections have been exhausted. If not, the rule connection is advanced at 220 (e.g. to 160) since a connection meeting rule connection 140 has been conditionally accepted. That is, the connection from pin 1 to pin 2 (or pin 3) will be part of the final solution unless a connection cannot be found among the remaining pins which will match a subsequent rule connection (e.g. 160).

In such a case, when the net node list is exhausted for a rule node at a current rule connection and a previous rule connection exists as is found at 211, a previously accepted condition will have precluded a solution with the current pin and net node assignment (if a solution is possible) and the process is regressed at 214 to an earlier rule connection to attempt to find another matching connection between the current "from" pin and the next unused pin in the list corresponding to the "to" node of the rule connection (e.g. 140), looping through operations 210, 211, 212, 217 and 218 which does not preclude a further matching connection in a possible solution.

When the current net node list is exhausted (211), and no previous rule connection exists (213) the current net node of the "from" pointer is marked unused and the pointer 110 advanced to the next unused net node. If, at 216, the net node list is found exhausted (and there are no previous rule connections), then all possible orderings have been found and the process branches to "done" 205. If, of course, previous rule connections exist, the process will be further regressed (even without testing pin assignment combinations beyond that at which no match was found) at 214 and the process repeated for the next net node of an earlier rule connection, discarding the current conditionally accepted connection for that rule connection.

If the net node list is not exhausted, subsequent orders will be defined by looping through operations 210, 211, 212, 217 and 218 and, if possible, 219 and 220. That is, each time the "to" node list is exhausted, the pointer corresponding to the "from" node of the same rule connection is advanced to the next unused net node and the process repeated until a match is found or the "from" node list exhausted. That is, if a match is found, the rule connection is advanced, as before, until a solution is found or the lack of a match again causes regression of the process.

On the other hand, if connection matches continue to be found until the rule connections are exhausted, as determined at 219, a solution will have been found which can be checked against desired criteria and determined whether the solution found is better than any previously found. Therefore, only a maximum of two solutions need ever be stored for optimization of the pin assignment and net ordering. Further, when a solution has been saved (or discarded as not better than a previous solution) only the remaining combinations of pins in the lists need be checked and the possible pin orders can thus be checked exhaustively by looping from 230 to 210 for solutions without repeating previous solutions or previously checked and discarded connections which do not lead to a solution.

In the interest of clarity, the following two examples of the operation of the invention will be set out in tabular form. These examples are directed to a four pin net having one transmitter pin and three receiver pins but differ in that Example 1 is assumed to have a length constraint which renders all permutations of pin assignment possible which are allowed under the rule node constraints whereas, for Example 2, the length constraints are assumed to be such that only one solution is possible. The rule node constraints are the same for both Examples and the same as illustrated in FIG. 1.

EXAMPLE 1

| Valid Orders | Rule Nodes | | | | Rule Node Incr. to first/next OR From - To connection check |
|---|---|---|---|---|---|
| | A | B | C | D | |
| | Initialization | | | | steps from flow chart 201–207 |
| | — | — | — | — | *A 208–209 |
| | 1 | — | — | — | B 210,211,212 |
| | 1 | 2 | — | — | A-B 217,218,219,220 passes |
| | 1 | 2 | — | — | C 210,211,212 |
| | 1 | 2 | 3 | — | B-C 217,218,219,220 passes |
| | 1 | 2 | 3 | — | D 210,211,212 |
| | 1 | 2 | 3 | 4 | C-D 217,218,219,230 passes |
| 1 | 1 | 2 | 3 | 4 | D 210,211,213,214 |
| | 1 | 2 | 3 | x | C 210,211,212 |
| | 1 | 2 | 4 | x | B-C 217,218,219,220 passes |
| | 1 | 2 | 4 | x | D 210,211,212 |
| | 1 | 2 | 4 | 3 | C-D 217,218,219,230 passes |
| 2 | 1 | 2 | 4 | 3 | D 210,211,213,214 |
| | 1 | 2 | 4 | x | C . |
| | 1 | 2 | x | x | B . |
| | 1 | 3 | x | x | A-B . |
| | 1 | 3 | 2 | x | C . |
| | 1 | 3 | 2 | x | B-C . |
| | 1 | 3 | 2 | x | D . |
| | 1 | 3 | 2 | 4 | C-D . |
| 3 | 1 | 3 | 2 | 4 | D . |
| | 1 | 3 | 2 | x | C . |
| | 1 | 3 | 4 | x | B-C . |
| | 1 | 3 | 4 | x | D . |
| | 1 | 3 | 4 | 2 | C-D . |
| 4 | 1 | 3 | 4 | 2 | D . |
| | 1 | 3 | 4 | x | C . |
| | 1 | 3 | x | x | B . |
| | 1 | 4 | x | x | A-B . |
| | 1 | 4 | x | x | C . |
| | 1 | 4 | 2 | x | B-C . |
| | 1 | 4 | 2 | x | D . |
| | 1 | 4 | 2 | 3 | C-D . |
| 5 | 1 | 4 | 2 | 3 | D . |
| | 1 | 4 | 2 | x | C . |
| | 1 | 4 | 3 | x | B-C . |
| | 1 | 4 | 3 | x | D . |
| | 1 | 4 | 3 | 2 | C-D . |

-continued

| Valid | Rule Nodes | | | | Rule Node Incr. to first/next | |
|---|---|---|---|---|---|---|
| Orders | A | B | C | D | OR | From - To connection check |
| 6 | 1 | 4 | 3 | 2 | D | 210,211,213,214 |
|  | 1 | 4 | 3 | x | C | 210,211,213,214 |
|  | 1 | 4 | x | x | B | 210,211,215,216 |
|  | 1 | x | x | x | *A | 215,216 |
| Done | x | x | x | x |  | 205 |

— initial condition
x overflowed (exhausted net node list)
* "From" node moved, all others are "to" node moves It should be noted from the foregoing that while 4!=24 permutations of four pins are possible, the initial screening or matching of the pin identities with the rule nodes reduces the number of permutations to be iterated to six, allowing the process to be accelerated while remaining exhaustive. Note also that there are no iterations seeking to assign a pin which has been used for another conditionally accepted pin assignment. Further, when a net node list has been exhausted the process "regresses" by only the minimum amount using the minimum number of processing steps and seeks solutions in a consistent order even when no tests fail. Additionally, step 230 is performed followed immediately by looping to 210 each time a solution is found and an optimum solution among the solutions found will be available at the time step 205 (Done) is finally reached.

EXAMPLE 2

| Valid | Rule Nodes | | | | Rule Node Incr. to first/next | | |
|---|---|---|---|---|---|---|---|
| Orders | A | B | C | D | OR | From - To connection check | |
|  | Initialization | | | | | steps from flow chart 201-207 | |
|  | — | — | — | — | *A | 208-209 | |
|  | 1 | — | — | — | B | 210,211,212 | |
|  | 1 | 2 | — | — | A-B | 217,218,219,220 | passes |
|  | 1 | 2 | — | — | C | 210,211,212 | |
|  | 1 | 2 | 3 | — | B-C | 217,218,219,220 | passes |
|  | 1 | 2 | 3 | — | D | 210,211,212 | |
|  | 1 | 2 | 3 | 4 | C-D | 217,218,219,230 | passes |
| 1 | 1 | 2 | 3 | 4 | D | 210,211,213,214 | |
|  | 1 | 2 | 3 | x | C | 210,211,212 | |
|  | 1 | 2 | 4 | x | B-C | 217,218 | fails |
|  | 1 | 2 | 4 | x | C | 210,211,213,214 | |
|  | 1 | 2 | x | x | B | 210,211,212 | |
|  | 1 | 3 | x | x | A-B | 217,218 | fails |
|  | 1 | 3 | x | x | B | 210,211,212 | |
|  | 1 | 4 | x | x | A-B | 217,218 | fails |
|  | 1 | 4 | x | x | B | 210,211,213 | |
|  | 1 | x | x | x | *A | 215,216 | |
| Done | x | x | x | x |  | 205 | |

— initial condition
x overflowed (exhausted net node list)
* "From" node moved, all others are "to" node moves It should be particularly noted from Example 2 that the process up to and including the two steps following the finding of the first solution are identical to Example 1 but that the second step following the first solution results in failure of the check of the connection in which pin 4 is assigned to node C. The failure of this check results in the incrementing of the net node C list to overflow and the regression of the process from node C to node B (the "from" node of the current rule connection) to attempt finding another pin assignment for the A-B connection in which node B is the "to" node. (Hence, the "*" notation appears only at the beginning and end of each example which denotes advancing of the "from" node; all other node advancing operations being considered to be performed on the "to" node of the current connection.) Even if not incremented to overflow, the advancing of the net node would prevent iteration of any combination of pin assignments which would contain the same pin assignment for the connection resulting in the failure by changing the "to" node of the connection.

Note further, that in the next step, the B node pointer is incremented to advance through the net node list (from pin 2 to pin 3) and the A-B connection (now from pin 1 to pin 3) is immediately tested and immediately followed by further advancing through the net node list upon failure of the A-B connection check. Additionally, it should be noted that the sequence of Example 2 is much shorter than that of Example 1 and will be completed much more quickly due to the suppressing of iterations. In this regard, it is significant that Example 2 contains only seven checks and only three checks resulting in failure. In general, the number of checks required will only exceed the number of solutions found by a relatively small number relative to n since previously successful checks for connections common to more than one solution need not be re-checked in accordance with the invention.

Perhaps more significantly, Example 2 contains only three failed checks while effectively eliminating five possible permutations as solutions. It can also be discerned from the foregoing that the more rigorous the rule connection constraints against which the possible solutions are tested and the fewer the possible solutions after screening pins against the rule nodes, the shorter the procedure in accordance with the invention will become.

Further, it should be appreciated that in accordance with the process of the invention, only the minimum excursions back and forth through the rule connections are made in order to again find a matching connection and the process proceeds very rapidly while exhaustively checking combinations of connections, matching against all wiring rules input as rule nodes and rule connections and finding the optimum solution among all solutions found. As pointed out above, the process is also accelerated by performing the check of net nodes against the rule nodes as part of the initialization process so the net node lists are as short as possible. In the case of a four pin net, for example, this reduction of length of the net node lists immediately reduces the possible number of solutions from 4!=24 to 6 even if the only constraint considered is the identity of the pins as receivers or transmitters.

The process is further accelerated in accordance with the invention by advancing the "to" net node pointers when the rule connection checking fails. This procedure eliminates the subsequent iteration of all net orderings which would include the failed connection together with previously assigned pins while providing the option of either checking or suppressing an iteration of the particular connection causing the failure in combination with other prior pin assignments.

In view of the foregoing, it is seen that the method and apparatus of the invention provide for fast determination and optimization of all solutions to pin assignment and net ordering which accommodates full and accurate checking against all wiring rules desired by an operator while reducing storage requirements radically and supporting an unlimited number of pins in a net.

It should also be recognized that while the primary application contemplated by the inventors for the present invention is in connection with the routing of electrical conductors for expanding the number of pins supportable in a net and to support simulations involving potentially tens of thousands of nets, the invention is also applicable to other electrical connection routing problems, such as cabling between frames and any other routing application such as airline flight routing or optimization of delivery routes as well as any application involving an optimization or comparison in accordance with evaluation criteria relative to an ordering of elements or constraints of topology, element identity or the like.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of checking an ordering of a plurality of elements against desired criteria, said method including the steps of forming a plurality of lists of said plurality of elements, dividing said desired criteria into a plurality of first criteria and a plurality of second criteria, screening individual elements of said plurality of lists against a respective one of said plurality of first criteria and limiting each said screened individual elements to any of said plurality of elements matching said respective first criteria, and comparing pairs of elements in different said screened lists against a respective one of said plurality of second criteria to determine if said compared pairs meet said respective one of said second criteria.

2. A method as recited in claim 1, wherein said forming step includes forming a number of said plurality of lists which equals the number of said plurality of elements.

3. A method as recited in claim 1, wherein said dividing step includes setting said plurality of first criteria such that the number of first criteria in said plurality of first criteria equals the number of said plurality of elements.

4. A method as recited in claim 1, wherein said dividing step includes setting said plurality of second criteria such that the number of second criteria in said plurality of second criteria is one less than the number of said plurality of elements.

5. A method as recited in claim 1, wherein individual elements of said plurality of elements includes identity information and criteria of said plurality of first criteria include a type criterion.

6. A method as recited in claim 1, wherein individual elements of said plurality of elements include location information and criteria of said second criteria include a distance criterion.

7. A method as recited in claim 1, wherein each of said plurality of elements, said plurality of first criteria and said plurality of second criteria has an order, said method including the further step of advancing through said order of elements in one of said lists when a respective one of said second criteria is not met.

8. A method as recited in claim 1, wherein each of said plurality of elements, said plurality of first criteria and said plurality of second criteria has an order, said method including the further steps of regressing through said order of said first criteria when one of said lists of said remaining elements of said plurality of elements is exhausted when a respective one of said second criteria is not met, and advancing through said order of elements in one of said lists.

9. A method as recited in claim 8, including the further steps of recording a pair of said plurality of elements in a respective one of said lists when one of said second criteria is not met, and advancing past said pair of said plurality of elements in said advancing step.

10. A method as recited in claim 1, wherein each of said plurality of elements, said plurality of first criteria and said plurality of second criteria has an order, said method including the further steps of recording a solution of an order of said plurality of elements when a last of said order of said second criteria is met and advancing through said order of elements in one of said lists.

11. A method as recited in claim 10, including the further steps of evaluating a further solution of said ordering of elements against said solution recorded in said recording step, and replacing said solution with said further solution in response to a result of said step of evaluating said further solution.

12. A method as recited in claim 1, wherein said plurality of elements include one of electrical connection pins, vias and t-junctions and wherein individual elements of said plurality of elements includes connection pin, via or t-junction information and criteria of said plurality of first criteria include an electrical node type criterion.

13. A method as recited in claim 1, wherein individual elements of said plurality of elements include electrical connection pin, via and t-junction location information and criteria of said second criteria include a distance criterion.

14. A method as recited in claim 1, wherein each of said plurality of elements, said plurality of first criteria and said plurality of second criteria has an order, said method including the further step of advancing through said order of said second criteria when a respective one of said second criteria is met.

15. A system for checking an ordering of a plurality of elements against desired criteria, said system comprising:

first storage means for storing a plurality of lists of said plurality of elements, second storage means for storing said desired criteria as a plurality of first criteria and a plurality of second criteria, means for screening individual elements of said plurality of lists against a respective one of said plurality of first criteria and limiting each said screened lists' elements to any of said plurality of elements matching said respective first criteria, and means for comparing pairs of elements in different said screened lists against a respective one of said plurality of second criteria to determine if said compared pairs meet said respective one of said second criteria.

16. A system as recited in claim 15, wherein said first storage means is a matrix having an equal number of columns and rows and a column for each one of said first criteria, each said list comprising one said column of said matrix.

17. A system as recited in claim 15, further including a pointer means for said second storage means, said pointer means selecting a location in said first storage means.

18. A system as recited in claim 17, further including a further pointer means to select a location in said second storage means.

19. A system as recited in claim 15, further including a third storage means for storing a pair of said elements which do not meet a respective one of said second criteria.

20. A system as recited in claim 15, further including means for storing a solution to said ordering of said elements, means for evaluating a further solution in accordance with said solution, and means for replacing said solution with said further solution in said means for storing a solution.

* * * * *